United States Patent [19]

Johnson

[11] 4,346,368
[45] Aug. 24, 1982

[54] DIGITAL-TO-ANALOG CONVERTER CAPABLE OF PROCESSING A SIGN MAGNITUDE OR ONES COMPLEMENT BINARY CODED INPUT

[75] Inventor: Walter J. Johnson, Seattle, Wash.

[73] Assignee: The Boeing Company, Seattle, Wash.

[21] Appl. No.: 96,901

[22] Filed: Nov. 23, 1979

[51] Int. Cl.³ ............................................. H03K 13/02
[52] U.S. Cl. ......................... 340/347 DA; 340/347 M
[58] Field of Search ...................... 340/347 M, 347 DA

[56] References Cited

U.S. PATENT DOCUMENTS 3,373,421  3/1968  Wang .......................... 340/347 DD
4,021,648  5/1977  Sakata ........................ 340/347 SY X

OTHER PUBLICATIONS

Sklar, 2's Complement Arithmetic Operations, Computer Design, vol. 11, No. 5, 5/1972, pp. 115–121.
The Engineering Staff of Analog Devices, Inc., Analog–Digital Conversion Handbook, 6/1972, pp. II-16 through II-27.

Primary Examiner—Thomas J. Sloyan
Attorney, Agent, or Firm—Cole, Jensen & Puntigam

[57] ABSTRACT

A conventional digital-to-analog converter (DAC) which has a plurality of input lines is modified by adding another input line below that of the original least significant bit position. The additional input line is connected internally of the DAC exactly like the original least significant bit line. External of the DAC, the input line connected to the most significant bit position of the DAC is a direct line, i.e. there are no additional elements in that input line. There is an inverter in the additional input line, while the intermediate input lines, which vary in number depending upon the length of the coded input, include EXCLUSIVE-NOR gates. A resistor sufficient in value to set the output of the DAC about zero is connected between the reference voltage input connection and the output connection of the DAC.

8 Claims, 5 Drawing Figures

| SIGN+<br>MAGNITUDE | TWO'S<br>COMPLEMENT | OFFSET<br>BINARY | ONE'S<br>COMPLEMENT | OUTPUT |
|---|---|---|---|---|
| 0011 | 0011 | 1011 | 0011 | +3 |
| 0010 | 0010 | 1010 | 0010 | +2 |
| 0001 | 0001 | 1001 | 0001 | +1 |
| 0000 | 0000 | 1000 | 0000 | 0 |
| 1000 | 0000 | 1000 | 1111 | 0 |
| 1001 | 1111 | 0111 | 1110 | -1 |
| 1010 | 1110 | 0110 | 1101 | -2 |
| 1011 | 1101 | 0101 | 1100 | -3 |

| SIGN<br>MAGNITUDE<br>CODE AT Δ | CODE AT Δ' | OUTPUT OF DAC<br>(WITHOUT<br>RESISTOR) | OUTPUT OF DAC<br>(WITH<br>RESISTOR) |
|---|---|---|---|
| 0011 | 01001 | 7 | +3 |
| 0010 | 01011 | 6 | +2 |
| 0001 | 01101 | 5 | +1 |
| 0000 | 01111 | 4 | 0 |
| 1000 | 10000 | 4 | 0 |
| 1001 | 10010 | 3 | -1 |
| 1010 | 10100 | 2 | -2 |
| 1011 | 10110 | 1 | -3 |

| ONES COMPLEMENT CODE AT Δ | CODE AT Δ' | OUTPUT OF DAC (WITHOUT RESISTOR) | OUTPUT OF DAC (WITH RESISTOR) |
|---|---|---|---|
| 0011 | 1010 | 11 | +3 |
| 0010 | 1100 | 10 | +2 |
| 0001 | 1010 | 9 | +1 |
| 0000 | 1000 | 8 | 0 |
| 1111 | 0111 | 8 | 0 |
| 1110 | 0101 | 7 | −1 |
| 1101 | 0011 | 6 | −2 |
| 1100 | 0001 | 5 | −3 |

DIGITAL-TO-ANALOG CONVERTER CAPABLE OF PROCESSING A SIGN MAGNITUDE OR ONES COMPLEMENT BINARY CODED INPUT

BACKGROUND OF THE INVENTION

This invention relates generally to the art of digital-to-analog converters (DAC), and more specifically concerns a DAC which is capable of processing a sign magnitude or ones compliment binary coded input.

There are two basic categories of conventional digital-to-analog converters: (1) a regular or straight DAC, which uses a DC reference voltage; and (2) a multiplying DAC, (MDAC) which uses an AC or DC reference voltage. Both the straight DAC and MDAC, however, are limited in the types of coded input they can process. Basically, there are five different binary codes: binary, offset binary, twos complement, ones complement, and sign magnitude. The conventional DACS are capable of processing straight binary, offset binary, and twos complement coded inputs, but are not capable of processing either sign magnitude or ones complement coded inputs. Both the sign magnitude and the ones complement coded inputs, however, are advantageous in many situations, because they are well adapted to generate symmetrical waveforms. Such binary inputs are potentially especially useful with MDACS for generating waveforms for modulated waveform synthesis applications, such as a graphic display. In order to take advantage of this capability, sign switches have been used at the output of conventional MDACS when the input is a sign magnitude code. However, this arrangement has a number of substantial operating disadvantages. Rather, extra circuitry or a computer is required to do a code conversion, which takes valuable time, and is expensive. There is no circuitry comparable to sign switches for one's complement, however, and thus, that input is not used at all.

Therefore, it is an object of the present invention to provide a DAC which overcomes one or more of the problems of the prior art noted above.

It is another object of the present invention to provide such a DAC which is capable of directly processing sign magnitude or ones complement coded inputs.

It is a further object of the present invention to provide such a DAC which constructed by modifying, in minimal fashion, a conventional digital-to-analog converter.

It is an additional object of the present invention to provide such a DAC which processes a sign magnitude or one's complement coded input substantially as quickly as other coded inputs.

It is yet another object of the present invention to provide such a DAC which processes sign magnitude/ones complement coded inputs without converting them to another input.

SUMMARY OF THE INVENTION

Accordingly, the present invention is a digital-to-analog converter which is capable of processing a sign magnitude or one's complement original binary code input. In such binary codes, a single analog reference numeral, such as zero, is represented by two different numbers in the original binary code input. The apparatus includes a digital-to-analog converter means which comprises (1) a conventional digital-to-analog converter having a plurality of input lines, adapted to respectively receive the bits of a given binary input, from the most significant bit to the least significant bit thereof, and (2) at least one additional input line connected to the conventional converter so that the input lines of said converter means include the input lines of the conventional converter plus the additional input line, the output of the conventional converter being the output of the converter means, the additional input line being connected in the conventional converter identically to the input line thereof which is adapted to receive the least significant bit of the binary input. The apparatus further comprises a circuit means which has a plurality of inputs at least equal to the number of bits in the original code input and a plurality of outputs no greater than the number of input lines of said converter means, the circuit means being responsive to the original code input to produce a modified code input which has one more bit than the original code input and which, when applied to said converter means, results in an analog output which corresponds to the original code input, in which output said single analog reference numeral is produced in response to the two different numbers in the original binary code input.

DESCRIPTION OF THE DRAWINGS

A more thorough understanding of the invention may be obtained by a study of the following detailed description taken in connection with the accompanying drawings in which.

DESCRIPTION OF THE PREFERRED EMBODIMENT

Figures 1, 2, 3:
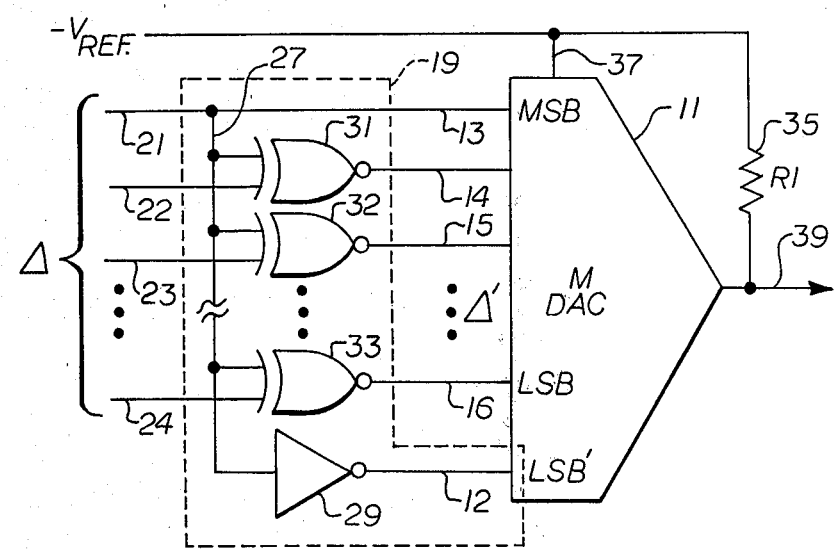
FIG. 1 is a diagram showing various coded inputs, and the corresponding bipolar voltage outputs, by convention.
FIG. 2 is a block diagram showing the DAC of the present invention, using a conventional MDAC with an extra least significant bit line, for processing a sign magnitude coded input.
FIG. 3 is a diagram showing the sign magnitude input code and the corresponding outputs of the DAC of FIG. 2.

FIG. 1 shows several binary codes and their analog convention equivalent. Each binary code shown has four bits, to illustrate a small range of outputs. Additional bits could be utilized in each code, of course, to expand the range of the output. Conventional digital-to-analog converters cannot process either the sign magnitude or the one's complement codes. These two codes are particularly useful, however, because, as is shown in FIG. 1, they have a capability of two different representations of zero. The other codes do not have this capability, again as illustrated in FIG. 1. The symmetrical sign magnitude and one's complement codes result in a symmetrical output about a reference point, such as zero, which is very desirable in certain analog applications, such as graphic displays.

FIG. 2 is a diagram of one embodiment of the apparatus of the present invention which is capable of directly processing sign magnitude coded inputs. Referring to FIG. 2, an otherwise conventional multiplying digitalto-analog converter (MDAC) referenced by numeral 11, is modified by the addition of another DAC input line 12. This input line is connected internally of the MDAC like the least significant bit (LSB) line 16. Thus, in effect, the modified MDAC of FIG. 2 has two LSB lines, and one more input line than the number of bits in the input code.

Although FIG. 2 shows an MDAC, a straight DAC could be used as well. In the embodiment shown, MDAC 11 has four conventional DAC input lines, 13–16, so that MDAC 11 is capable of processing a four bit conventional coded input. MDAC 11 could of course have additional input lines, in accordance with the size of the input code. As shown in FIG. 2, the bit input on line 13 is the most significant bit (MSB) in the coded input, while the bit input on line 16 is the least significant bit (LSB) in the coded input. The bit on line 12 is an additional least significant bit, referred to as LSB', and is not part of the actual coded input character nor is it found in conventional MDACs. It is produced in a manner explained in the following paragraphs.

The numeral 19 refers to a circuit which is added to an MDAC, interposed between the DAC input lines 12–16 and the code input lines, over which the actual coded input is applied to the DAC. The code input lines, referenced by the numerals 21–24, respectively, carry the input code into circuit 19. The number of code lines is equal to the number of bits in the input code character, so that the four code lines in FIG. 2 will accommodate a four bit sign magnitude input code. The most significant bit in any one character input will appear on line 21, while the least significant bit will be on line 24.

Circuit 19, interposed between code input lines 21–24 and DAC input lines 12–16 performs a simple code adjustment. The code on the code input lines 21–24, for purposes of illustration, is referenced by the symbol $\Delta$ and the modified code, at the DAC input lines 12–16, is referenced by the symbol $\Delta'$. In circuit 19, there is a straight-through connection between code input line 21 and DAC input line 13, so that the most significant bit in the coded input will appear directly on DAC input line 13, i.e. at the MSB place in the DAC. Code input line 21 is also connected through an inverter 29 to DAC input line 12. The bit on DAC input line 12 is thus an inversion of the MSB bit on code input line 21.

Intermediate of DAC input lines 12 and 13 are DAC input lines 14–16, with the bit on line 16 being the least significant bit in the input character, i.e. the bit on line 24. Circuit 19 includes a plurality of EXCLUSIVE NOR gates 31–33, the output of each gate, respectively, being connected to a DAC input line. The number of EXCLUSIVE NOR gates in circuit 19 is thus equal to the number of DAC input lines minus two, one for the MSB line and the other for the LSB' line. In FIG. 2, three EXCLUSIVE NOR gates are shown, for a four bit character input. EXCLUSIVE NOR gates are conventional devices, designed to implement a particular boolean algebra function, and are commercially available.

Each EXCLUSIVE NOR gate has two inputs. One input for each gate is a direct connection to code input line 21, on which appears the most significant bit of the input character. The other input connection to the respective gates are the respective code input lines 22–24. Hence, the inputs to gate 31 are code input lines 21 and 22 and the output of gate 31 is connected to DAC input line 14. The inputs to gate 32 are code input lines 21 and 23 and the output of gate 32 is connected to DAC input line 15. The inputs to gate 33 are code input lines 21 and 24, and the output of gate 33 is connected to DAC input line 16.

The apparatus of the present invention also includes a resistance 35 which is connected between the conventional voltage reference input 37 and the output line 39 of MDAC 11. A resistor is used for a current output DAC, while an operational amplifier is used for a voltage output DAC. The value of resistance 35 must be sufficient in order to set the output of the DAC symmetrically about zero, and will hence vary from DAC to DAC. The value of the resistance to obtain symmetry in a particular case can typically be obtained from the manufacturer of the DAC.

The above described structure will directly process a sign magnitude coded input to produce an output which is symmetrical about zero, without any of the disadvantages of a sign switch on the output. FIG. 3 shows, for a small range of inputs, the operation of the apparatus of the present invention. The column at the far left is the sign magnitude coded input to the apparatus, i.e. the coded input at the position in FIG. 2 on the code input lines 21–24. The code in the next column, labeled $\Delta'$, is the code present on DAC input lines 12–16 which corresponds to the associated code in the first column. The $\Delta'$ code has one more bit, LSB', than the $\Delta$ code, since another line is added, as explained in detail above. The most significant bit in the $\Delta'$ code is identical to the most significant bit in the $\Delta$ code, while the least significant bit in the $\Delta'$ code is the inverse of the most significant bit in the $\Delta$ code. The bits in the intermediate places are determined by the action of the EXCLUSIVE NOR gates 31–33.

The output of the DAC without resistance 35 is shown in the next column, while the last column shows the output of the DAC with resistance 35, which has the effect of centering the output of the DAC about zero.

Figures 4, 5:
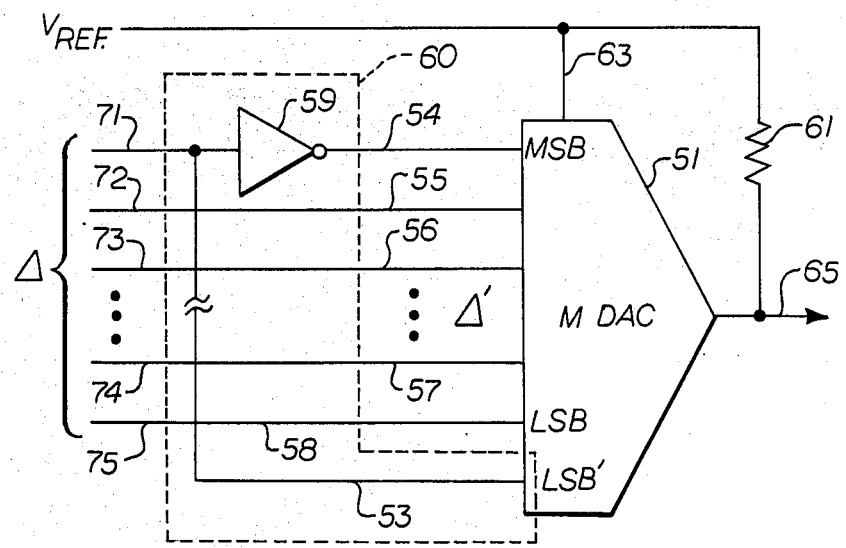
FIG. 4 is a block diagram showing the DAC of the present invention, using a conventional MDAC with an extra least significant bit line, for processing a one's complement coded input.
FIG. 5 is a diagram showing the one's complement input code and the corresponding outputs of the DAC of FIG. 4.

FIG. 4 shows the embodiment of the apparatus of the present invention which is capable of processing a one's complement coded input. MDAC, or DAC, 51 is conventional, except for the additional line 53 which forms a new least significant bit, referred to as LSB', just like the MDAC of FIG. 2. MDAC 51 in the embodiment shown responds to positive logic. This line is connected internally of MDAC 51 in similar fashion as the LSB line 58. The other DAC input lines, beginning with the most significant bit place, are labeled as lines 54–58 in FIG. 4.

Code input lines 71–75 are provided to carry the one's complement coded input, referred to as $\Delta$, into circuit 60, which converts that code to a new code, referred to as $\Delta'$, which appears on the DAC input lines 53–58.

Code input line 71 receives the most significant bit of the one's complement input character. Line 71 is connected to the input of an inverter 59, the output of which is connected to the most significant bit DAC input line 54, so that the bit on line 54 is the inverse of the bit on line 71. Line 71 is also connected directly to line 53, so that the most significant bit of the input character appears at the LSB' line of the DAC input. The remaining coded input lines 72–75 are connected directly to corresponding DAC input lines 55–58. Thus, the bits which appear on coded input lines 72–75 appear, respectively, on DAC input lines 55–58.

The apparatus also includes resistance 61, which is connected between the voltage reference input connection 63 and the output connection 65 of DAC 51. The purpose of resistance 61, like resistance 35 in FIG. 2, is to offset the output of the MDAC so that it is symmetrical about zero. Thus a resistor is necessary for a current output device, and an operational amplifier is necessary for a voltage output device.

FIG. 5 is similar in organization to FIG. 3, as it shows a one's complement input code for a small range in the first column at the far left of the figure, which is the code referred to in the Δ position in FIG. 4. The circuit converts the code at Δ to a DAC input code at Δ', which is shown in the next column. The following columns, respectively, show the output of the apparatus without the resistor 61 and with the resistor 61, which offsets the output so that it is symmetrical about zero, which is the desired result.

In the event that the MDAC or DAC has more input lines than the modified input code, the unused input lines are all tied to the additional input line, and the results are the same as described above.

The embodiments disclosed above provide a direct processing of two binary codes which each have dual representation of a single analog numeral, which can be zero with appropriate adjustment. In each case, a conventional DAC is modified by adding one input line below the least significant bit line of the DAC. Relatively simple circuits in each case are interposed between the input lines of the DAC and the binary coded input, to effect an initial simple code adjustment. The resulting analog output of the DAC may then be offset by means of a resistor or an operational amplifier to make the DAC output symmetrical about zero, if so desired. No sign switches at the output of either embodiment are thus necessary.

Although preferred embodiments of the invention have been disclosed herein for purposes of illustration, it should be understood that various changes, modifications and substitutions may be incorporated in such embodiments without departing from the spirit of the invention, as defined by the claims which follow.

What is claimed is:

1. A digital-to-analog converter for processing an original binary code input in which a single analog reference numeral, such as zero, is represented by two different numbers in the original binary code input, the apparatus comprising:

digital-to-analog converter means, including a conventional digital-to-analog converter having a plurality of input lines, adapted to respectively receive the bits of a given binary input, from most significant bit to least significant bit thereof, the conventional converter being modified to include at least one additional input line so that the input lines of said converter means include the input lines of said conventional converter plus the additional input line, the output of said conventional converter being the output of said converter means, the conventional converter being further modified to include means connecting the additional input line in said conventional converter redundantly with equal weighting to the input line thereof adapted to receive the least significant bit; and circuit means, having a plurality of inputs at least equal to the number of bits in the original code input and a plurality of outputs no greater than the number of input lines of said converter means, said circuit means being responsive to the original code input to produce a modified code input which has one more bit than the original code input and which, when applied to said converter means, results in an analog output which corresponds to the original code input, in which output said single analog reference numeral is produced in response to the two different numbers in the original binary code input.

2. An apparatus of claim 1, including means for adjusting the output of the converter means such that the analog reference numeral is zero, resulting in the output of said converter means being symmetrical about zero.

3. An apparatus of claim 1, wherein said circuit means includes a first circuit means portion receiving the most significant bit of the original code input, said first circuit means portion being connected to the additional input line of said converter means.

4. An apparatus of claim 2, wherein said conventional converter has a reference voltage input connection and an output connection, and wherein said adjusting means is connected between said reference voltage input connection and said output connection.

5. An apparatus of claim 4, wherein the conventional converter is a current output device, and said adjusting means is a resistor.

6. An apparatus of claim 4, wherein the conventional converter is a voltage output device, and said adjusting means is an operational amplifier.

7. An apparatus of claim 3, wherein said first circuit means portion is an inverter, and wherein said circuit means further includes a second circuit means portion which is a direct line connection receiving the most significant bit in the original code input and applying it directly to the one input line of the converter means which is adapted to receive the most significant bit of the original code input, and wherein said circuit means includes a plurality of remaining circuit portions, each remaining circuit portion including an EXCLUSIVE NOR gate, the EXCLUSIVE NOR gates having output lines connected, respectively, to successive input lines of said converter means following said one input line, excluding the additional input line, each EXCLUSIVE NOR gate further having two input connections, one input connection of each gate receiving the most significant bit from the original code input, the other respective input connection of the respective gates receiving the successive bits of the original code input following the most significant bit.

8. An apparatus of claim 3, wherein said first circuit portion is a direct line connection receiving the most significant bit in the original input code and applying it directly to the additional input line of the converter means, and wherein said circuit means further includes a second circuit portion comprising an inverter which receives the most significant bit in the original input code and is connected to the one input line of the converter means which is adapted to receive the most significant bit of the original code input, and wherein said circuit means includes a plurality of remaining circuit portions comprising direct line connections which receive the successive bits of the original code input following the most significant bit and apply them to the successive input lines of said converter means following said one input line.

* * * * *